United States Patent
Rich

(10) Patent No.: US 6,446,855 B1
(45) Date of Patent: *Sep. 10, 2002

(54) COMPACT REFLOW AND CLEANING APPARATUS

(75) Inventor: Randall L. Rich, Plano, TX (US)

(73) Assignee: Speedline Technologies, Inc., Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/252,377

(22) Filed: Feb. 18, 1999

(51) Int. Cl.[7] .......................... B23K 5/22; B23K 20/14; B23K 28/00; B08B 3/00
(52) U.S. Cl. .......................... 228/19; 228/201; 228/42; 219/388; 134/105
(58) Field of Search .............. 228/19, 201, 42; 118/503; 134/105; 219/388

(56) References Cited

U.S. PATENT DOCUMENTS

| | | | | |
|---|---|---|---|---|
| 3,882,816 A | * | 5/1975 | Rooz et al. ............ | 118/57 |
| 4,655,164 A | * | 4/1987 | Nelson et al. .......... | 118/503 |
| 4,682,563 A | * | 7/1987 | Masuda et al. .......... | 118/503 |
| 4,725,716 A | * | 2/1988 | Entwistle et al. ....... | 219/388 |
| 4,884,738 A | * | 12/1989 | Bourrieres ............. | 228/180.21 |
| 5,030,293 A | * | 7/1991 | Rich et al. ............ | 134/32 |
| 5,181,648 A | * | 1/1993 | Leicht ................. | 228/201 |
| 5,192,582 A | | 3/1993 | Liedke et al. .......... | 228/206 |
| 5,374,331 A | * | 12/1994 | Costello ............... | 156/640 |
| 5,388,327 A | | 2/1995 | Trabucco ............... | 28/830 |
| 5,471,033 A | * | 11/1995 | DiPaolo et al. ......... | 219/388 |
| 5,492,265 A | | 2/1996 | Wandke | |
| 5,524,810 A | | 6/1996 | Wathne ................. | 228/42 |
| 5,553,633 A | | 9/1996 | Ciccarelli, Jr. et al. .. | 134/74 |
| 5,564,159 A | * | 10/1996 | Treiber ................ | 15/302 |
| 5,573,174 A | * | 11/1996 | Pekol .................. | 228/219 |
| 5,758,817 A | * | 6/1998 | Chapman ................ | 228/19 |
| 5,922,230 A | * | 7/1999 | Yokota ................. | 219/388 |
| 6,354,481 B1 | * | 3/2002 | Rich et al. ............ | 134/105 |

FOREIGN PATENT DOCUMENTS

| | | | | |
|---|---|---|---|---|
| JP | 03077138 | | 10/1992 | ............ H05K/3/26 |
| JP | 9-246712 | * | 9/1997 | ................ 228/264 |

* cited by examiner

Primary Examiner—Tom Dunn
Assistant Examiner—L. Edmondson
(74) Attorney, Agent, or Firm—Mintz, Levin, Cohn, Ferris, Glovsky and Popeo, P.C.

(57) ABSTRACT

A compact reflow oven and cleaning apparatus combines in a unitary housing for both the reflow and cleaning function. This results in the saving of valuable floor space in the printed circuit board assembly areas. The unitary housing and control of temperatures in the reflow and cleaning areas facilitate the removal of contaminants before solidification of such contaminants.

29 Claims, 8 Drawing Sheets

US 6,446,855 B1

COMPACT REFLOW AND CLEANING APPARATUS

FIELD OF THE INVENTION

This invention relates to the processing of electronic components and assemblies, and in particular to the reflow of solder and cleaning of the components.

BACKGROUND OF THE INVENTION

The manufacture of electronic assemblies and components commonly involves the mounting of individual electronic devices, such as transistors, integrated circuits, resistors and the like on pre-printed circuit boards. The assemblies and components are then reflowed and often cleaned.

The manufacture of Ball Grid Array (BGA) components and assemblies commonly involves the mounting of solder balls or prepared spheres on pre-printed circuit boards or substrates on the bottom surface of an integrated circuit, such as a so-called flip chip. In a typical process, the circuit boards and substrates will be processed through a line of machines which include a magazine unloader, a ball mounter, an inspection machine, a 1 to 3 converter, a reflow apparatus, a cleaning apparatus, a 3 to 1 converter and a magazine loader. These machines take considerable floor space and limit the production line that can be utilized in a given amount of relatively expensive floorspace. After mounting, reflow and cleaning, the BGAs become the input/output paths for electron flow to the next level assembly.

Since most assembly of BGA components and assemblies is performed in a clean room environment with very expensive floor space costs, there is an ongoing need to conserve floorspace. Thus, it would be of great benefit to provide greater efficiency to the manufacturing process and to reduce the required floor space for the manufacturing process.

SUMMARY OF THE INVENTION

In accordance with one aspect of the present invention, an apparatus is providing for processing electronic components which travel along first and second conveyors in a pre-determined direction. The apparatus includes a frame contained in unitary housing. A reflow assembly is mounted on the frame within the unitary housing and has a reflow conveyor conveying the electronic component from the first conveyor in a reflow direction non-parallel to the pre-determined direction to reflow solder on the electronic component. The apparatus also has a cleaning assembly mounted on the frame also within the unitary housing and has a cleaning conveyor conveying the electronic component from the reflow conveyor in a cleaning direction generally opposite to the reflow direction to clean the electronic component and deliver the electronic component to the second conveyor.

In accordance with another aspect of the present invention, the reflow direction and cleaning direction are perpendicular to the pre-determined direction.

In accordance with another aspect of the present invention, a unitary compact reflowing and cleaning apparatus is provided and is specially suited for the reflowing and cleaning of BGA components of silicon chips which are manufactured in either strip form or individually held in JEDEC type trays, boats or carriers, in contrast to the typically larger sized printed circuit boards for which most of the present commercial reflow ovens and cleaning devices are designed.

In yet another aspect of the present invention through the use of selective blower manipulation and the utilization of negative pressure, a reflow oven and cleaner may be housed within a unitary housing without the risk of contamination of one process by the other process taking place within that same unitary housing.

In accordance with yet another aspect of the present invention, the cleaning portion of the apparatus operates with a cleaning fluid at a temperature more elevated than is typical with present commercial cleaners. The heightened temperature of the fluid within the cleaning apparatus minimizes the temperature difference between strips or trays exiting the reflow portion of the apparatus and allows a reflow and cleaning more rapidly than with the typical present day installations. This is because, in the apparatus of the present invention, the BGA components or chips contained in the strips or in JEDEC trays, boats or carriers, do not cool down as much and therefore can be cleaned sooner since they are cleaned prior to reaching room temperature and before typical contaminants present after reflow fully solidify or cure.

In accordance with yet another aspect of the present invention, the reflow portion of the apparatus of the present invention utilizes IR heating to rapidly reflow the BGA components or other chips in either strip form or held in JEDEC trays, boats or carriers. Convection or conduction heating may alternatively be used.

BRIEF DESCRIPTION OF THE DRAWINGS

A more complete understanding of the invention and its advantages will be apparent from the following detailed description when taken in conjunction with the accompanied drawings, in which.

DETAILED DESCRIPTION

Figure 1:
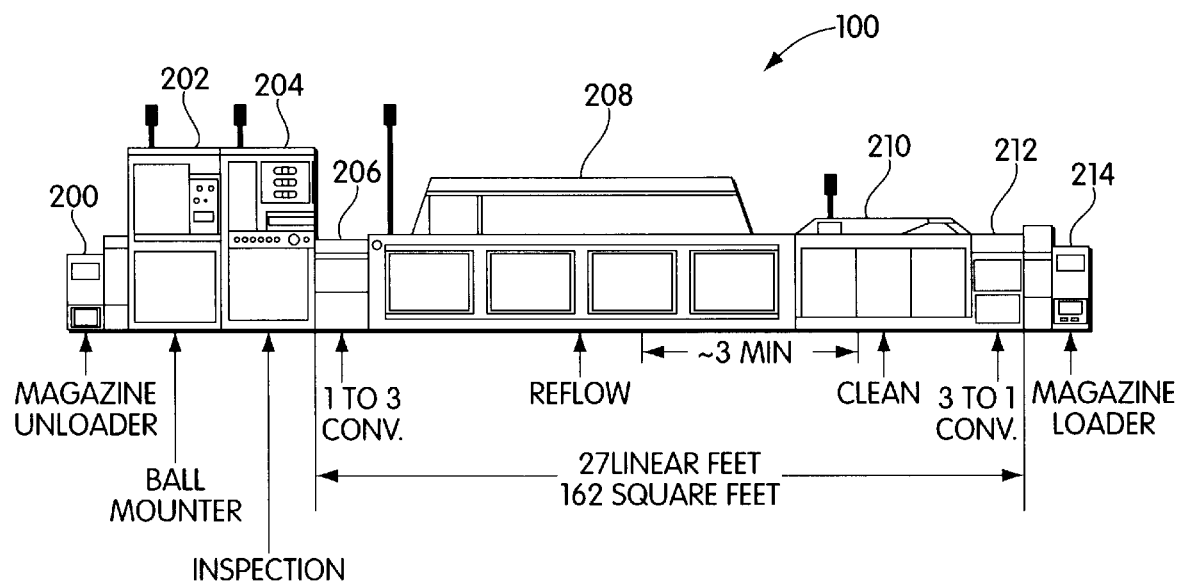
FIG. 1 illustrates a conventional processing line.

Referring now to the drawings, wherein like reference characters designate like or corresponding parts throughout the several views, an improved combined reflow and cleaning apparatus 10 will be described.

With reference to FIG. 1, a conventional, present-day, commercially-available electronic manufacturing line 100 is illustrated. The line begins with a magazine unloader 200, a ball mounter 202, an inspection apparatus 204 and a 1 to 3 converter 206. Typical manufacturers of such equipment are Motorola, Vanguard, Shibuya, Panasonic-KME and Speedline Technologies, Inc. It is to be understood that the sequence of machines in the electronic manufacturing line may be reversed and thus instead of the process moving left to right it may move in a right to left direction.

The manufacturing line 100 illustrated is a line which is particularly adopted for the placement of the small solder spheres which have been referred to above as BGAs onto the surface of integrated circuits, or onto the surface of an interposer upon which the integrated circuit is mounted. These BGA components are small and can be thought of as being small circuit boards having a number of soldersperes or BGAs placed and affixed to their bottom surfaces. In operation, the ball mounter 202 is utilized to mount a number and perhaps a large number of BGAs on the underside of the component. Eventually the component with attached BGAs will be mounted upon a larger printed circuit board but the BGAs must be more or less permanently attached to the component. This is conventionally performed by reflowing the solder contained within the BGAs and then cleaning the BGAs and component to which they are attached of flux and other contaminants which arise from the reflow process in a conventional manner.

Following the 1 to 3 converter 206 is a reflow apparatus 208 to reflow solder on the circuit boards. Such apparatus can be obtained from Research Int., Dover -Vitronix, Electrovert, Heller and BTU. Subsequent to the reflow apparatus 208 is a cleaning apparatus 210 to clean flux residues and other contaminants from the circuit boards. Cleaning apparatus can be supplied from GPD, Dover-Vitronix and Accel. Following apparatus 210 is a 3 to 1 converter 212 and another magazine loader 214. The linear distance encompassed by the devices between the 1 to 3 converter 206 and the 3 to 1 converter 212 can be, for example, typically 27 linear feet, with the apparatus, in combination, taking up 162 square feet of floor space. The cost of the units would be at present between $200,000 and $250,000 and must be supplied from three different vendors.

Figure 2:
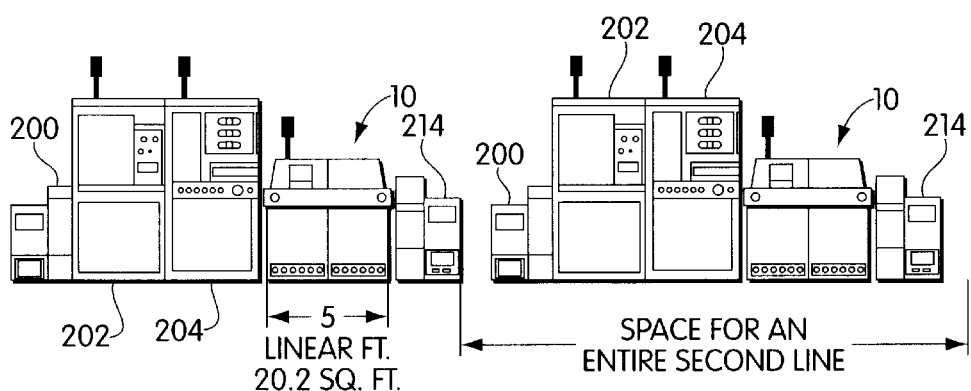
FIG. 2 illustrates a processing line incorporating a first embodiment of the present invention.

The present invention provides a reflow and cleaning apparatus 10 which can be used in place of the apparatus 206, 208, 210 and 212. The reflow and cleaning apparatus 10 may take only five linear feet of the assembly line, and 20 square feet of floor space, saving considerable space as compared to the prior apparatus. As is well know, the cost of floor space in a semi-conductor or printed circuit board or other electronic assembly line is extremely expensive due to, among other things, environmental controls, the need for temperature and cleanliness standards, etc. By utilizing the reflow and cleaning apparatus 10 of the present invention, considerable cost savings can be realized. The cost could be competitive with the apparatus replaced and can be supplied by a single vendor. As illustrated in FIG. 2, the same linear distance formerly required for one manufacturing line, as illustrated in FIG. 1, can be, using the reflow and cleaning apparatus 10, used for two completely separate manufacturing lines.

With reference now to FIGS. 3-12, the reflow and cleaning apparatus 10, which forms a first embodiment of the present invention, will be described. The apparatus 10 includes a frame 12 which mounts a reflow assembly 14 for reflowing solder on circuit boards 15, mounted on strips (FIG. 3) or in trays, boats or carriers, 62 (FIG. 5) and a cleaning assembly 18 for cleaning the circuit boards 15 after the reflow operation.

Figure 3:
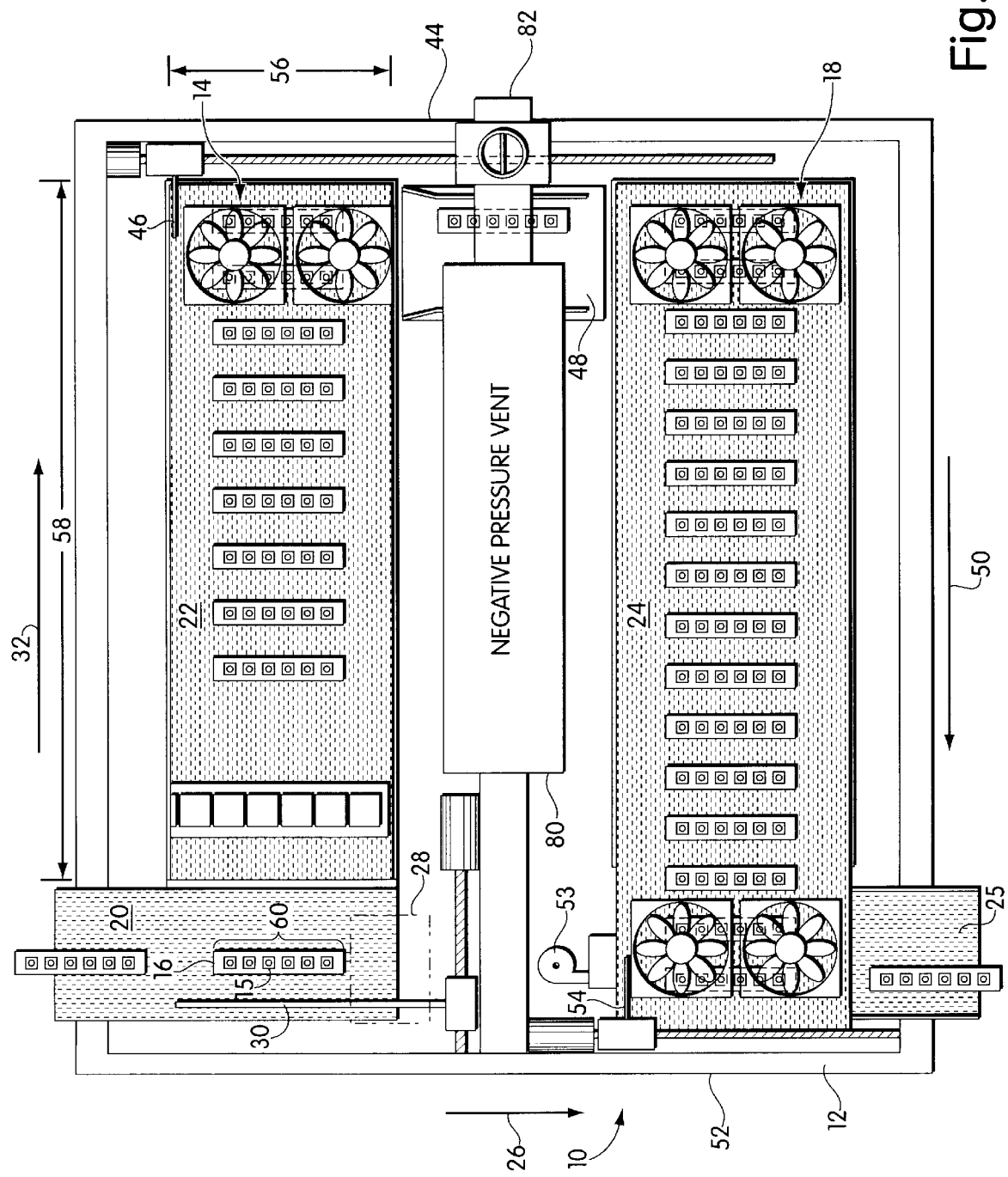
FIG. 3 is a plan view of the first embodiment of the present invention illustrating the conveyor paths for use with the strips.
Figure 12:
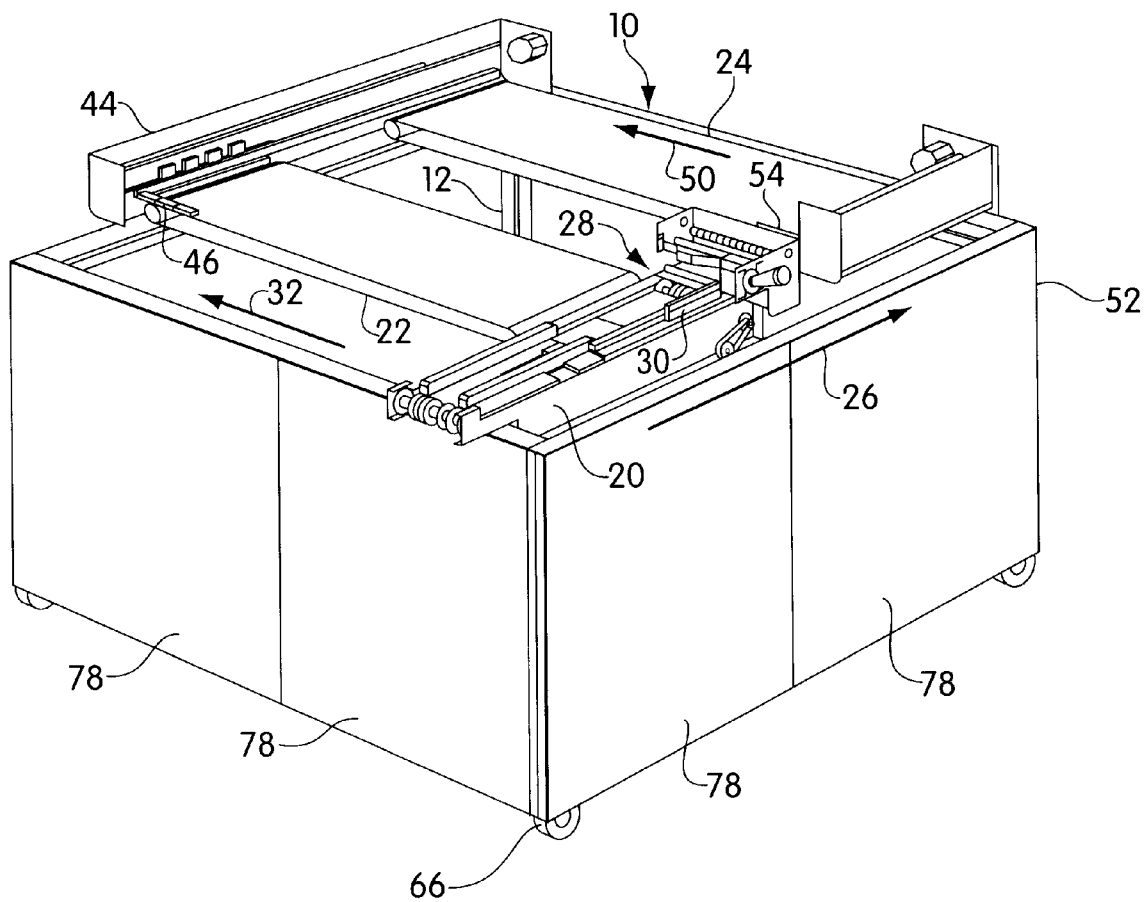
FIG. 12 is a perspective view detailing the conveyor apparatus of the embodiments of FIGS. 3–5.

As can be seen in FIGS. 3 and 12, the apparatus has a series of conveyors, including an inlet conveyor 20, a reflow conveyor 22, and a cleaning conveyor 24. The inlet conveyor 20 will take the BGA components 15 in strip forms 16 (FIG. 3) or individually in trays, boats or carriers 17 (FIG. 5) to be processed from the inspection apparatus 204 and convey the components along the linear direction 26 of the manufacturing line. As a strip 16 approaches the inner end 28 of the inlet conveyor 20, sensors of a well-known type in the art in the apparatus will cause sweeping members 30 to move from the position shown in FIG. 12 toward the reflow conveyor 22 in a direction 32 perpendicular to the linear direction 26 to move the strip 16 onto the beginning of the reflow conveyor 22. The reflow conveyor 22 conveys the strip 16 along a reflow direction 32, which is generally perpendicular to the linear direction 26.

Figure 4:
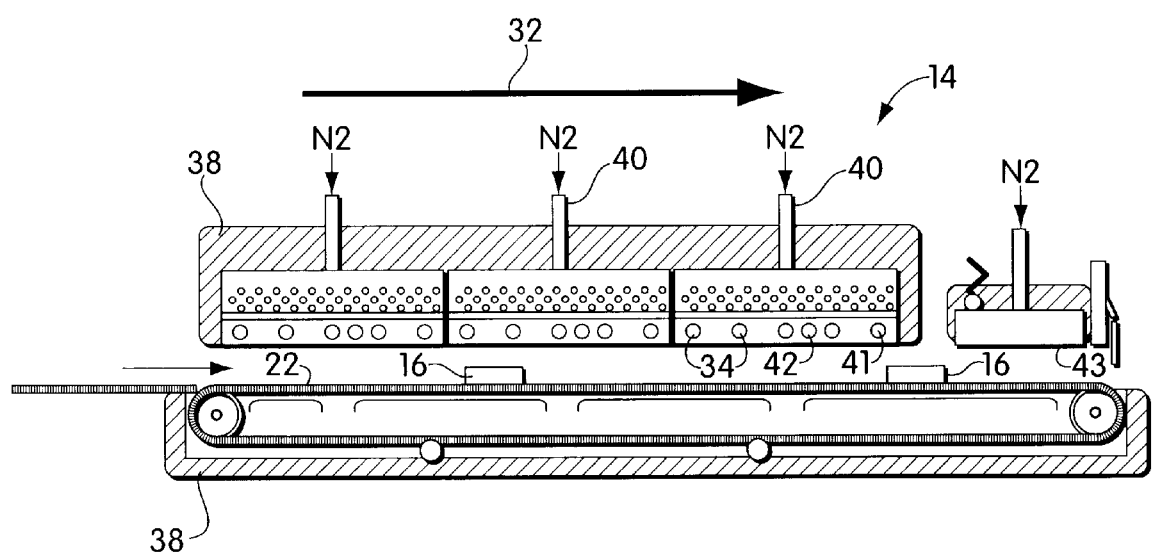
FIG. 4 is a partial side view of the reflow assembly.

With reference to FIG. 4, as the strips 16 are conveyed along the reflow conveyor 22, they are heated by heating members 34 to reflow the solder on the boards. The heating members 34 can, for example, be heat lamps, but may also be of convection or conduction type. The reflow assembly 14 provides insulation 38 to confine the elevated temperature to the reflow assembly. If desired, nitrogen gas can be supplied to the reflow assembly through inlets 40. The temperature within the reflow assembly 14 is controlled by the use of thermocouples 42 which are monitored by appropriate circuitry within the apparatus 10. Preferably the heating members 34 may comprise IR-type heaters rather than the more conventional convection heaters which are used in many reflow ovens.

An advantage of an IR-type heater is that it can bring the solder to reflow temperature more quickly than a conventional convection-type heating system and thus reflow can be accomplished more quickly and with the use of less energy. In conventional reflow ovens, large size printed circuit boards which are reflowed typically have a number of different components to be affixed to the board. These components may, and often do, differ greatly in their color. For example, while some integrated circuits may be black and thus tend to absorb heat, other elements such as capacitors or other discreet devices may be light in color such as white or yellow, which have differing heat and absorption characteristics than black devices.

In addition, the printed circuit board itself which may be typically of a dark green tone may have a heat absorption which differs from the heat absorption characteristics of the devices which are to be mounted upon the printed circuit board. This causes or can cause differential heating of the devices and thus differential reflow rates which is undesirable.

With the device of the present invention, however, the apparatus is especially suited for the reflow of BGAs mounted upon the undersides of integrated circuits. In these arrangements, each of the BGA components contained in the strips or the JEDEC trays, boats or carriers are generally of uniform color in that there is no or little variation within the BGA components of the strip or the JEDEC trays, boats or carriers. Thus, IR-type heating can be utilized to heat either strips or trays, boats or carriers without the reflow differential problems discussed above. It should be noted that at the end of the reflow cycle, that is, after the strip 16 shown in FIG. 4 passes the last heating member 41, the strip 16 will proceed along the belt 22 to a cooling zone 43 which may utilize chilled water or other refrigerant or a Peltier-type device to further cool down the strip after reflow, if desired.

With reference to FIG. 3 AND FIG. 12, as the strips 16 approach the back 44 of the apparatus 10 near the back end of the reflow conveyor 22, appropriate sensors in the apparatus move sweeping members 46 from the position shown in FIG. 12 along the linear direction 26. The sweeping members 46 move the strips 16 off of the reflow conveyor 22, over a flat stationary surface 48 and onto the beginning of the cleaning conveyor 24. After the sweeping members 46 convey strip 16 from the reflow conveyor 22 to the cleaning conveyor 24, the sweeping members 46 are retracted to the position shown in FIG. 12 ready to push the next strip 16 moving toward the end of the reflow conveyor 22.

The cleaning conveyor 24 will move the strips from the back 44 in a cleaning direction 50 which is also generally perpendicular to the linear direction 26 and in the opposite direction to the reflow direction 32, toward the front 52 of the apparatus 10. As the strips 16 move through the cleaning assembly 18, the circuit boards 15 are cleaned. The cleaning of the circuit boards maybe achieved by a fog of water vapor or water at about 95° C. However, more conventional cleaning techniques may be used.

In conventional reflow/cleaning processes, the printed circuit board will go through an inline reflow oven operation which oven typically includes a cool down section which lowers the temperature of the board or other electronic assembly to aid in reflow solidification. The board is then removed from the reflow oven and conveyed to the next inline piece of equipment which is the cleaner. It is well known in the art that once a board or other electronic assembly has been cooled down, various contaminants such as flux and other materials may partially or fully solidify or cure on the board and/or devices mounted on the board. Thus, in the cleaning process following the reflow process, the cleaning water must bring up the temperature of the board or other electronic assembly to a temperature where the fluxes and other contaminants may be washed off. By contrast, in the present invention in which the reflow oven and the cleaner are within a common housing, the reflow oven includes a programmable cooling assembly and the heating water in the cleaning section uses high temperature water or even water vapor at elevated temperatures. The control of the temperatures in the reflow section and the changing sections may be any of a number of well-known heating and temperature control methods. With the use of the present invention, the board, chip or other electronic assembly will not have sufficient cool down time to cause curing of flux or other contaminants on the board but rather such contaminants will remain in an incured, semi-solid state. They will be conveyed almost immediately from the reflow path to the cleaning path and, because temperature differential between the exit from the cooling reflow path and the entrance of the cleaning path is short fluxes and other contaminants may be easily washed off in the cleaning portion of the present invention since the fluxes or other contaminants will not have cured. This provides substantial savings in time within which to process an individual board, strip or tray, as well as saving on energy that would require the repeated heating and cooling of the printed circuit board, strip or tray, boat or carrier with mounted chips.

Furthermore, an additional advantage of the temperature control of the present invention is that the printed circuit board or strip or JEDEC tray, boat or carrier will emerge from the cleaning section hotter in temperature than from conventional cleaners, thus allowing rapid drying of the devices due to the evaporation of water vapor due to the higher temperature of the devices mounted in the strips 16 or the JEDEC trays, boats or carriers, 18.

Typically, a reflow temperature in the reflow portion of the oven will be in the vicinity of 360° Fahrenheit but may vary from about ambient to about 600° F, but usually not less than about approximately 375° F. during reflow operation. Typically, cleaners comprise a wash section and a rinse section. The typical temperature of the water in the cleaning section may range from 120–160° F. for the wash section and 120° F.–210° F. for the rinse section. Suitable temperatures are about 145° F. for the wash water and about 210° F. for the rinse water, but generally not less than about approximately 145° F. In either case, it is desirable that the temperature of an electronic component leaving the reflow assembly not be below that of the temperature of the wash water in the washing section. By well known means and temperature control devices, these temperatures may be maintained by regulation of the heating in the reflow and cleaning sections.

Furthermore, with the containment of both the reflow oven and the cleaning apparatus within a unitary housing and with control of closely controlled temperatures, as discussed above, and further by control of the speed of the belts 22 and 24, the total average time of processing of a single strip or JEDEC tray, boat or carrier, can be reduced by a full three minutes or more in a process which would normally take in the conventional line shown in FIG. 1 of between 7 and 10 minutes. Thus, in the present device, cleaning begins to take place after reflow within 15–45 seconds after the strip or JEDEC tray, boat or carrier, containing components leaves the reflow portion of the present apparatus.

Additionally, the end portion of the conveyor 24 in the cleaning section may include a heat blower 53 which blows heated air onto the upper or upper and lower surfaces of the strip 15 or tray 18 to further dry the devices after the cleaning process, thus augmenting drying by evaporation of water vapor from the devices.

As the strips 16 approach the end of the cleaning conveyor 24 near the front 52 of the apparatus 10, sensors will sense their presence and activate sweeping members 54 to sweep the strips 16 off of the cleaning conveyor 24 along the linear direction 26 and push the strips onto a chute 25 and out of the apparatus 10 into the next state of the production line.

As will be clear from FIG. 3, the ratio of the width 56 to length 58 of the reflow conveyor 22 and similar dimensions of cleaning conveyor 24 are important. As illustrated, the strips 16 will enter the apparatus 10 with their elongate length 60 parallel the linear direction 26. This orientation is maintained throughout the apparatus 10 as the width 56 of the reflow conveyor and width of the cleaning conveyor are adequate to accommodate the elongate length 60 of the strips. Generally, the linear speed of the inlet conveyor 20 will exceed that of the reflow and cleaning conveyors. For example, the inlet conveyor 20 may move in the linear direction 26 between 12 to 84 inches per minute. 60 inches per minute would equate to four trays 62 per minute, while 84 inches per minute would equate to ten strips 16 per minute. In contrast, the reflow conveyor 22 and cleaning conveyor 24 may be operated in a range of 3 to 24 inches per minute. The process speed may be 24 inches per minute for 10 strips per minute or 20 inches per minutes for 3 trays per minute. The length 58 of the reflow conveyor and length of the cleaning conveyor should be sufficient so that the outlet of strips 16 and trays 62 from the apparatus 10 occurs at the same rate as the inlet of strips 16 and trays 62 at the inlet conveyor 20. While the time interval between the completion of the reflow operation and the beginning of the cleaning operation may vary, it may be desirable with the present invention to fix that interval anywhere from 1 to 120 seconds, and even preferably less than 120 seconds.

Figure 5:
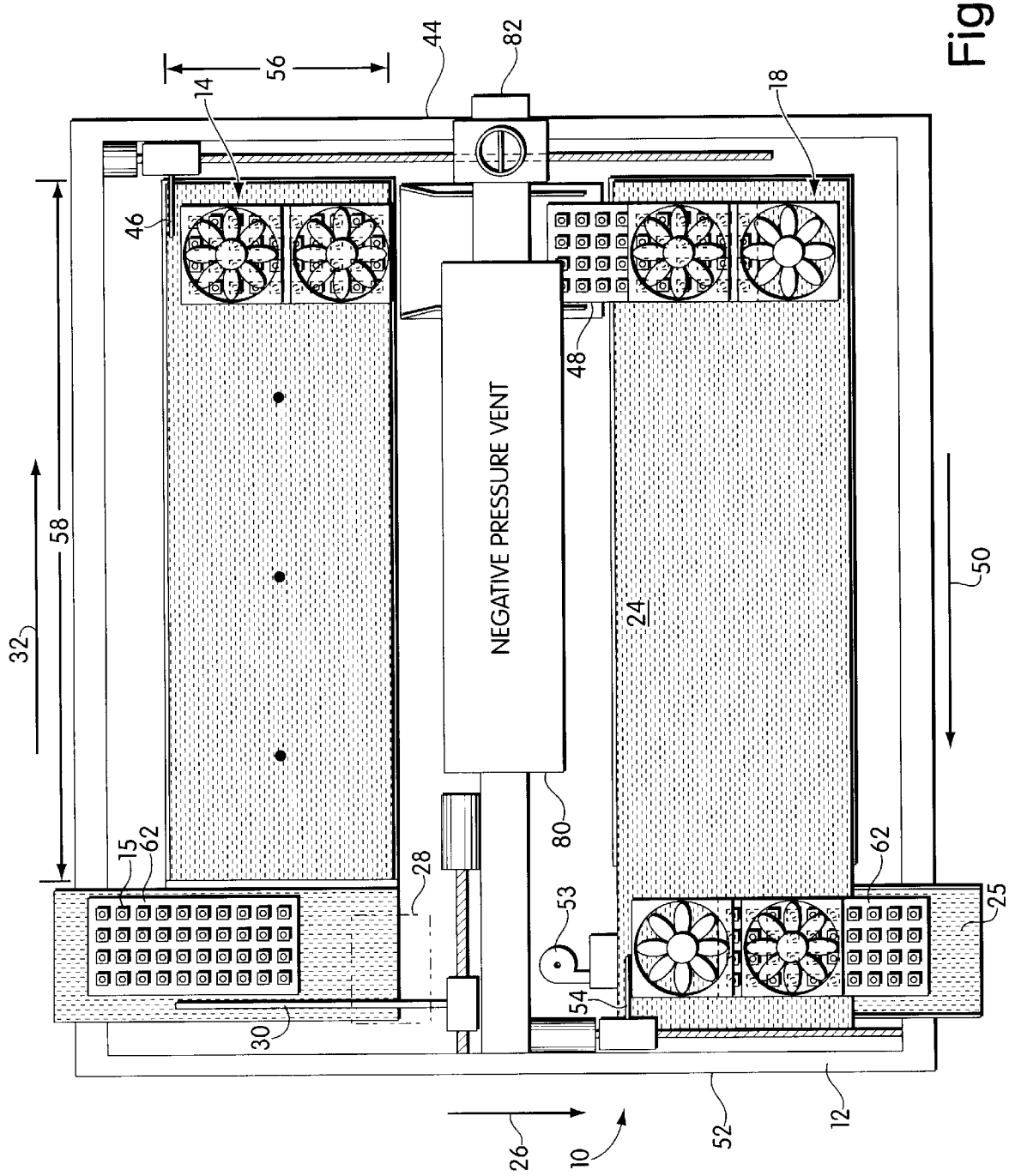
FIG. 5 is a plan view of the first embodiment of the present invention illustrating conveyors for trays.
Figure 6:
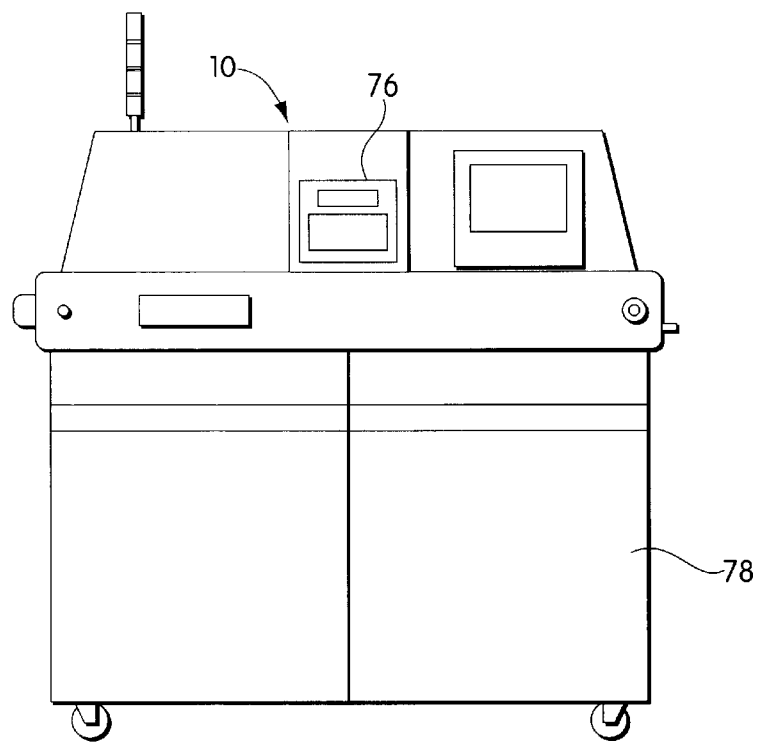
FIG. 6 is a front view of the embodiment.
Figure 7:
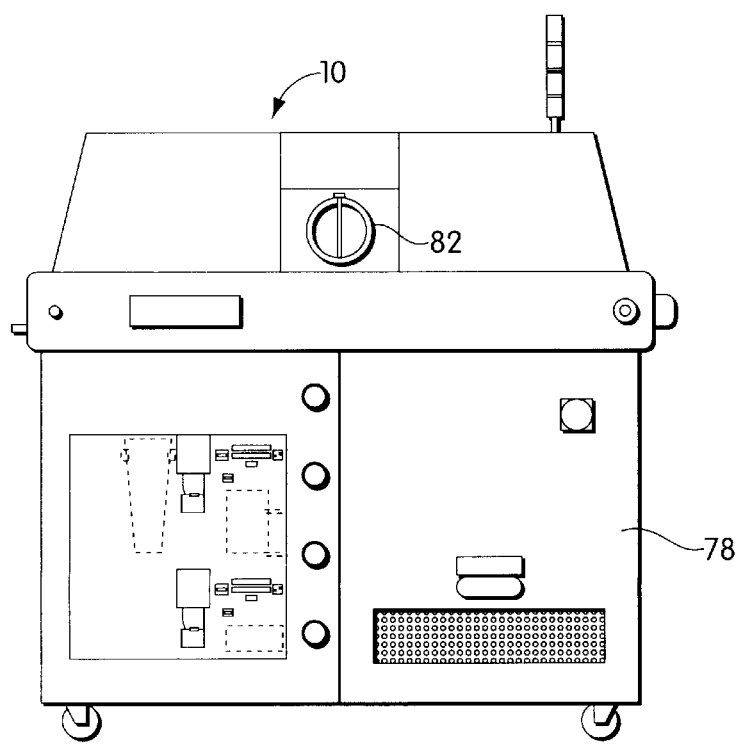
FIG. 7 is a back view of the embodiment.
Figure 8:
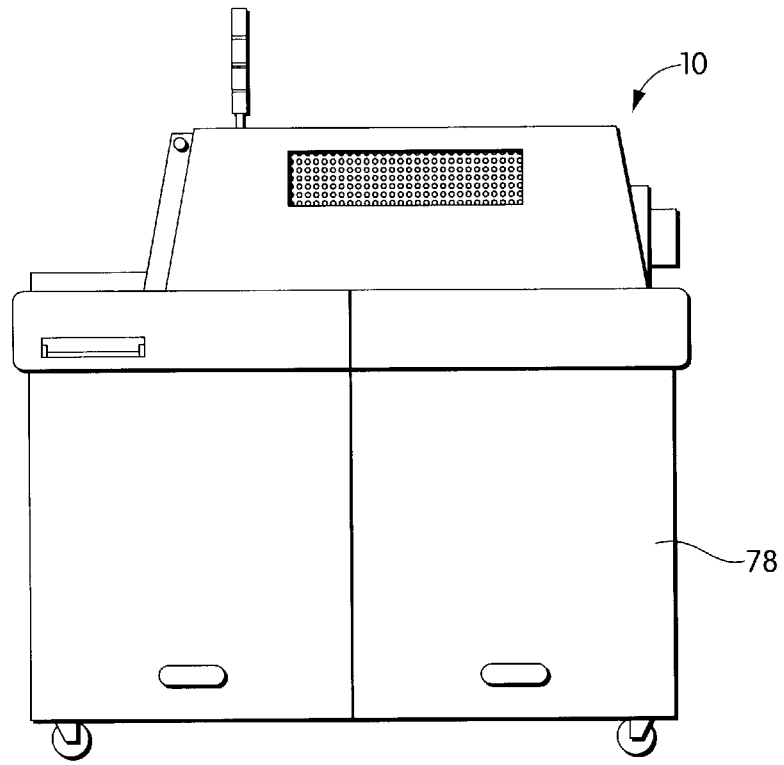
FIG. 8 is a first side view of the embodiment.
Figure 9:
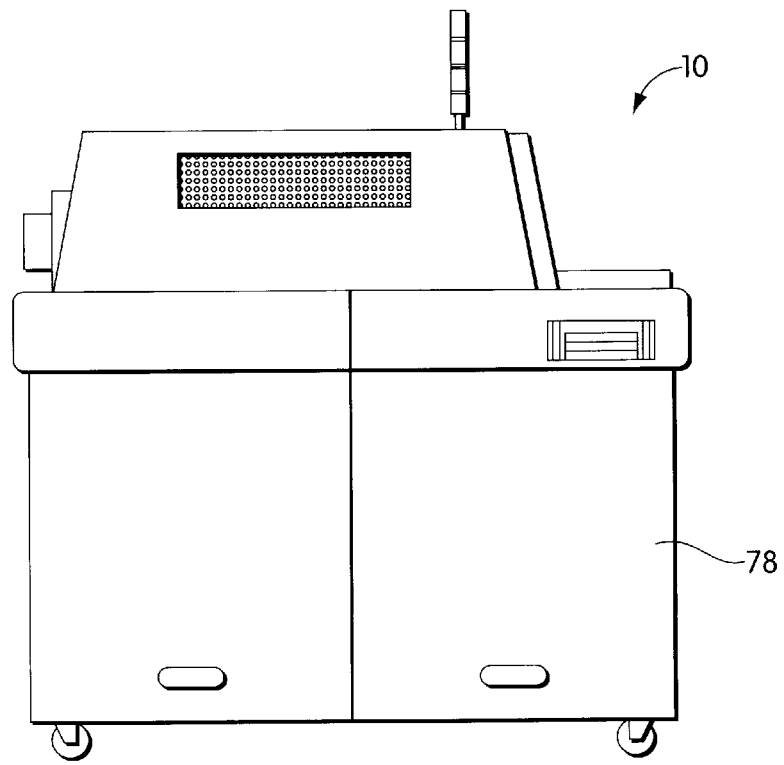
FIG. 9 is an opposite side view of the embodiment.
Figure 10:
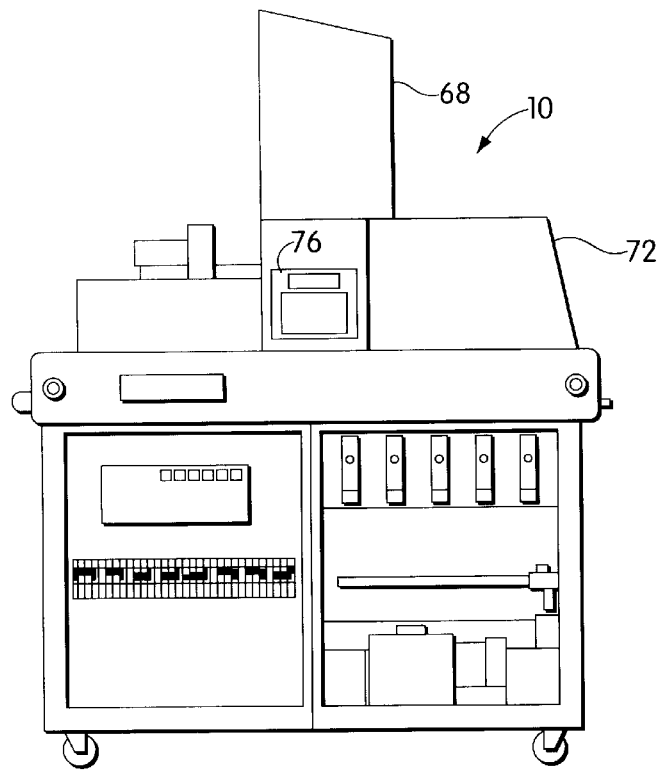
FIG. 10 is a front view illustrating the lid on the reflow assembly lifted.

FIG. 5 illustrates the use of apparatus 10 with individual trays 62 full of BGA components 15. These trays shown may be JEDEC - type trays of the type referred to above or other type, boat or carrier. The movement of trays 62 through apparatus 10 is substantially identical to the movement of strips 16 discussed above.

Figure 11:
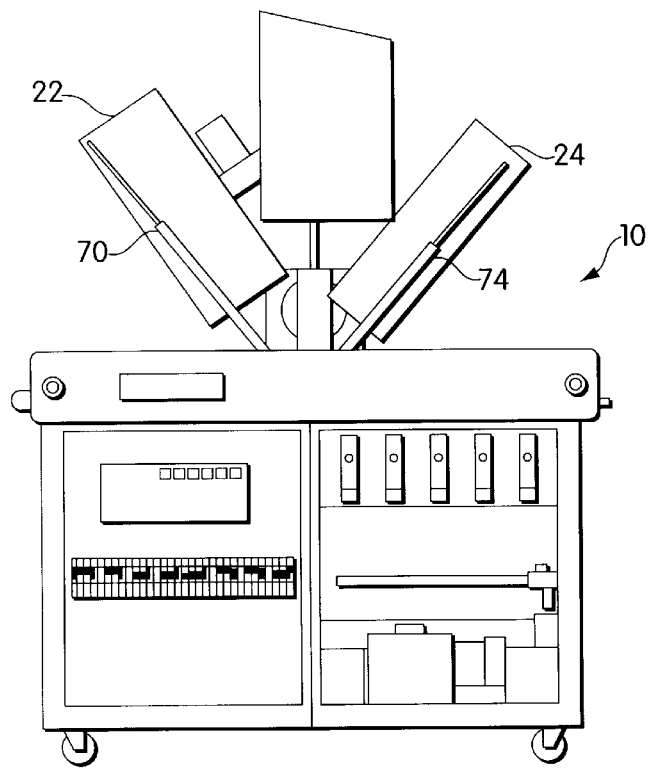
FIG. 11 is a front view of the embodiment illustrating the lids of the reflow assembly and cleaning assembly lifted.

With reference to FIGS. 6–12, the frame 12 can be seen to be mounted on wheels 66 to facilitate movement of the apparatus 10. Preferably, the reflow assembly 14 will be provided with a lid 68 which can be moved between the closed position, shown in FIG. 6-9, to an open position, shown in FIG. 10, to access the reflow conveyor 22 and related equipment. Further, the reflow conveyor 22, itself, can be mounted on a pivoting apparatus for lifting to an inspection and repair position, as seen in FIG. 11, assisted by gas lift tubes 70. Similarly, the cleaning assembly 18 will include a lid 72 which can be moved to the open position and the cleaning conveyor 24 is pivotally mounted so it can be pivoted to an inspection and repair position, as seen in FIG. 11, supported by gas lift tubes 74.

A control panel 76 is mounted on the front 52 of the apparatus 10 for controlling the processes within the apparatus 10. Various panels 78 can be mounted on the frame 12 to conceal various components within the apparatus 10 necessary for its function. A negative pressure vent 80 is provided with an external exhaust duct 82 to draw gases from the machine if required. Inasmuch as the present invention incorporates what was formally two process steps in one piece of machinery in a unitary housing, the potential exists for gases, water vapor,flux,etc. to migrate from one conveyor to the other conveyor system, which is obviously undesirable. The negative pressure vent and external exhaust duct 82 acts to seperate the two conveyors so that such contaminants do not flow from one area to the other thus further making the process of reflow cleaning more efficient and quick.

Although a single embodiment of the present invention has been illustrated in the accompanying drawings and described in the foregoing detailed description, it will be understood that the invention is not limited to the embodiment disclosed, but is capable of numerous rearrangements, modifications and substitutions of parts and elements without departing from the scope and spirit of the invention.

What is claimed is:

1. An apparatus for reflowing solder on and cleaning an electronic component or assembly, the apparatus comprising:

a unitary housing containing a solder reflow assembly and a cleaning assembly;

an inlet conveyor mounted in the housing to convey the electronic component or assembly to the solder reflow assembly;

the solder reflow assembly being mounted in the housing and having a first conveyor which receives the electronic component or assembly from the inlet conveyor and conveys the electronic component or assembly in a reflow direction, the solder reflow assembly having one or more conductive heating members to raise the temperature in the solder reflow assembly to reflow solder on the electronic component or assembly;

the cleaning assembly being mounted in the housing and having a second conveyor separate and independent from the first conveyor, the second conveyor being oriented generally in a direction opposite from and parallel to the first conveyor to convey the electronic component or assembly in a cleaning direction, the first and second conveyors being coplanar, the cleaning assembly having a mechanism to provide wash water and rinse water at elevated temperatures; and a plurality of movable sweeping members, the sweeping members moving the electronic component or assembly from the inlet conveyor to the beginning of the first conveyor and from the end of the first conveyor to the beginning of the second conveyor and from the end of the second conveyor to a mechanism to move the electronic component or assembly out of the apparatus.

2. The apparatus claim 1, wherein the solder reflow direction and the cleaning direction are perpendicular to a direction in which the inlet conveyor conveys the electronic component or assembly and a direction in which the mechanism moves the electronic component or assembly out of the apparatus.

3. The apparatus of claim 1, wherein the electronic component or assembly is one of a plurality of electronic components or assemblies in strip form.

4. The apparatus of claim 1, wherein one or more electronic components or assemblies are carried in trays, boats or carriers.

5. The apparatus of claim 1 wherein the cleaning assembly provides wash and rinse water at elevated temperatures.

6. The apparatus of claim 1, further comprising a negative pressure vent and a gas control mechanism to separate the solder reflow assembly from the cleaning assembly and to prevent contaminants from traveling from the solder reflow assembly to the cleaning assembly and from the cleaning assembly to the solder reflow assembly.

7. The apparatus of claim 1, wherein the electronic component or assembly is heated and reflowed utilizing IR-type heaters.

8. The apparatus of claim 1 wherein the temperature in the reflow assembly ranges from about ambient to about 600 degrees Fahrenheit and the temperature of the rinse water in the cleaning assembly ranges in temperatures from about ambient to about 210 degrees Fahrenheit.

9. An apparatus for reflowing and cleaning electronic components or assemblies, the apparatus comprising:

a unitary housing;

a reflow assembly mounted within the housing having a reflow conveyor, the first conveyor reflowing and conveying an electronic component assembly in a direction towards a cleaning assembly;

the cleaning assembly mounted within the housing and having a second conveyor separate and independent of the first conveyor for washing, the second conveyor oriented generally in a direction opposite from and parallel to the first conveyor for conveying the electronic component or assembly along a cleaning station, the first and second conveyors being coplanar; and the cleaning assembly washing by water at temperatures in the range of approximately about ambient to approximately about 210° Fahrenheit and wherein the temperature differential between the cleaning temperature and the reflow temperature is between approximately about 600° Fahrenheit and 145° Fahrenheit.

10. The apparatus of claim 9 wherein the operating temperature of the wash water is approximately about 145 degrees Fahrenheit and the rinse water in the cleaning section is approximately about 210 degrees Fahrenheit.

11. The apparatus of claim 9 wherein the first conveyor and the second conveyor are parallel to each other and convey in opposite, parallel directions.

12. The apparatus of claim 9 wherein the direction of movement of the first conveyor and the second conveyor are perpendicular to a predetermined inline direction.

13. The apparatus of claim 9 wherein the temperature range of the first conveyor and the second conveyor prevents the full solidification or curing of flux and other contaminants contained within solder attached to the electronic components during reflow as the electronic component moves conveyed along the first conveyor.

14. The apparatus of claim 9 wherein the temperature of an electronic component assembly between the reflow assembly and a washing stage of the cleaning assembly never falls below the temperature of the water for washing.

15. The apparatus of claim 1, wherein a time between completion of reflowing and beginning of washing is between 1 and 120 seconds.

16. The apparatus of claim 9 wherein the temperature within the reflow conveyor is not less than about approximately 375° F. and the temperature in the cleaning assembly is not less than about approximately 145° F. degrees.

17. The apparatus of claim 10 wherein the time from the solidification of the solder after reflow until the commencement of cleaning is less than 120 seconds.

18. The apparatus of claim 1, wherein the one or more conductive heating members are operable to raise the temperature in the solder reflow assembly in a range of about ambient to about 600° F.

19. The apparatus of claim 1, wherein the cleaning assembly mechanism to control the temperatures of the wash and rinse waters is operable to control the temperature of the wash water in a range of about 120° F. to about 160° F., and to control the temperature of the rinse water in a range of about 120° F. to about 210° F.

20. The apparatus of claim 1, wherein the one or more conductive heating members are operable to raise the temperature in the solder reflow assembly in a range of about ambient to about 600° F, and the cleaning assembly mechanism to control the temperatures of the wash and rinse waters is operable to control the temperatures of the wash and rinse waters in a range of about ambient to about 210° F.

21. The apparatus of claim 1, wherein the cleaning assembly mechanism to control the temperatures of the wash and rinse waters is operable to control the temperatures of the wash and rinse waters in a range of about ambient to about 210° F, wherein the temperature differential between the wash and rinse waters and the solder reflow assembly is between about 600° F. and about 145° F.

22. The apparatus of claim 1, wherein the cleaning assembly mechanism to control the temperatures of the wash and rinse waters is operable to control the temperature of the wash water at about 145° F. and to control the temperature of the rinse water at about 210° F.

23. The apparatus of claim 1, wherein the one or more conductive heating members are operable to control the temperature in the solder reflow assembly to not less than about 375° F., and the cleaning assembly mechanism to control the temperatures of the wash and rinse waters is operable to control the temperatures of the rinse and water waters to not less than about 145° F.

24. The apparatus of claim 1, wherein the solder reflow assembly is arranged and configured and the one or more conductive heating member are operable to control the temperature in the solder reflow assembly such that the electronic component or assembly exits the solder reflow assembly at a temperature above a solidification temperature to cure a flux or other contaminants contained in a solder attached to the electronic component or assembly.

25. The apparatus of claim 1, wherein the solder reflow assembly further includes one or more sensors to activate the sweeping members to convey the electronic component or assembly from the solder reflow assembly to the wash water of the cleaning assembly within a desired period of time such that the temperature of the electronic component or assembly is above the temperature of the wash water.

26. The apparatus of claim 1, wherein the solder reflow assembly further includes one or more sensors to activate the sweeping members to convey the electronic component or assembly from the solder reflow assembly to the wash water of the cleaning assembly within a period of time ranging from about 1 to about 120 seconds such that the temperature of the electronic component or assembly is above the temperature of the wash water.

27. The apparatus of claim 1, wherein the one or more conductive heating members includes one or more infra-red heaters.

28. The apparatus of claim 1, wherein the one or more conductive heating members are distributed in a substantially linear array along the reflow direction.

29. The apparatus of claim 1 further comprising one or more thermocouples to control the temperature in the solder reflow assembly.

* * * * *

UNITED STATES PATENT AND TRADEMARK OFFICE
CERTIFICATE OF CORRECTION

PATENT NO.   : 6,446,855 B1
DATED        : September 10, 2002
INVENTOR(S)  : Randall L. Rich It is certified that error appears in the above-identified patent and that said Letters Patent is hereby corrected as shown below:

<u>Column 9,</u>
Line 3, please delete "component" and insert -- components -- therein.
Line 4, please delete "moves" and insert -- are -- therein.

<u>Column 10,</u>
Line 9, please delete "rinse and water" and insert -- wash and rinse -- therein.

Signed and Sealed this

Eleventh Day of February, 2003

JAMES E. ROGAN
*Director of the United States Patent and Trademark Office*